(12) United States Patent
Rayaprolu et al.

(10) Patent No.: US 11,282,564 B1
(45) Date of Patent: Mar. 22, 2022

(54) SELECTIVE WORDLINE SCANS BASED ON A DATA STATE METRIC

(71) Applicant: Micron Technology, Inc., Boise, ID (US)

(72) Inventors: Vamsi Pavan Rayaprolu, San Jose, CA (US); Kishore Kumar Muchherla, Fremont, CA (US); Harish R. Singidi, Fremont, CA (US); Ashutosh Malshe, Fremont, CA (US); Gianni S. Alsasua, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/094,970

(22) Filed: Nov. 11, 2020

(51) Int. Cl.
  *G11C 11/406* (2006.01)
  *G11C 11/408* (2006.01)
  *G11C 11/409* (2006.01)
  *G11C 29/44* (2006.01)

(52) U.S. Cl.
  CPC ...... *G11C 11/40622* (2013.01); *G11C 11/409* (2013.01); *G11C 11/4085* (2013.01); *G11C 29/44* (2013.01)

(58) Field of Classification Search
  CPC .......... G11C 11/40622; G11C 11/4085; G11C 11/409; G11C 29/44
  See application file for complete search history.

(56) References Cited

U.S. PATENT DOCUMENTS

| | | | | |
|---|---|---|---|---|
| 8,503,257 B2* | 8/2013 | Post | ...................... | G11C 29/82 365/200 |
| 9,910,730 B2* | 3/2018 | Yang | ........................ | G11C 7/04 |
| 10,083,069 B2* | 9/2018 | Jeon | ..................... | G11C 29/028 |
| 10,884,628 B2* | 1/2021 | Yang | ..................... | G06F 3/0679 |
| 10,896,123 B2* | 1/2021 | Yang | ..................... | G11C 16/26 |
| 10,910,068 B2* | 2/2021 | Takizawa | .......... | H01L 27/11556 |

* cited by examiner

*Primary Examiner* — Tri M Hoang
(74) *Attorney, Agent, or Firm* — Lowenstein Sandler LLP

(57) ABSTRACT

Systems and methods are disclosed including a memory device and a processing device operatively coupled to the memory device. The processing device can perform operations including identifying, among a first plurality of wordlines of a set of pages of the memory device, at least one wordline having a current value of a data state metric satisfying a first condition; determining new values of the data state metric of a second plurality of wordlines of the set of pages, wherein the at least one wordline is excluded from the second plurality of wordlines; and responsive to determining that the new values of the data state metric of one or more wordlines of the second plurality of wordlines satisfy a second condition, performing a media management operation with respect to the one or more wordlines.

20 Claims, 6 Drawing Sheets

200

```
┌─────────────────────────────────────────────────────┐
│ IDENTIFYING, AMONG A FIRST PLURALITY OF WORD LINES OF A │
│ SET OF PAGES OF THE MEMORY DEVICE, AT LEAST ONE WORD │
│ LINE HAVING A CURRENT VALUE OF A DATA STATE METRIC  │
│ SATISFYING A FIRST CONDITION                        │
│ 210                                                 │
└─────────────────────────────────────────────────────┘
                          │
                          ▼
┌─────────────────────────────────────────────────────┐
│ DETERMINING NEW VALUES OF THE DATA STATE METRIC OF A │
│ SECOND PLURALITY OF WORD LINES OF THE SET OF PAGES, │
│ WHEREIN THE AT LEAST ONE WORD LINE IS EXCLUDED FROM │
│ THE SECOND PLURALITY OF WORD LINES                  │
│ 220                                                 │
└─────────────────────────────────────────────────────┘
                          │
                          ▼
┌─────────────────────────────────────────────────────┐
│ RESPONSIVE TO DETERMINING THAT THE NEW VALUES OF THE │
│ DATA STATE METRIC OF ONE OR MORE WORD LINES OF THE  │
│ SECOND PLURALITY OF WORD LINES SATISFY A SECOND     │
│ CONDITION, PERFORMING A DATA STATE MANAGEMENT       │
│ OPERATION WITH RESPECT TO THE ONE OR MORE WORD LINES│
│ 230                                                 │
└─────────────────────────────────────────────────────┘
```

```
┌─────────────────────────────────────────────────┐
│ IDENTIFYING A FIRST PLURALITY OF WORD LINES AMONG A │
│ SECOND PLURALITY OF WORD LINES OF A SET OF PAGES OF A │
│ MEMORY DEVICE, WHEREIN THE FIRST PLURALITY OF WORD │
│ LINES IS FEWER THAN THE SECOND PLURALITY OF WORD LINES │
│                       310                       │
└─────────────────────────────────────────────────┘
                         │
                         ▼
┌─────────────────────────────────────────────────┐
│ DETERMINING VALUES OF A DATA STATE METRIC OF EACH OF │
│         THE FIRST PLURALITY OF WORD LINES       │
│                       320                       │
└─────────────────────────────────────────────────┘
                         │
                         ▼
┌─────────────────────────────────────────────────┐
│ RESPONSIVE TO DETERMINING THAT THE VALUES OF THE DATA │
│   STATE METRIC OF ONE OR MORE WORD LINES OF THE FIRST │
│ PLURALITY OF WORD LINES SATISFY A CONDITION, PERFORMING │
│ A DATA STATE MANAGEMENT OPERATION WITH RESPECT TO THE │
│          SECOND PLURALITY OF WORD LINES         │
│                       330                       │
└─────────────────────────────────────────────────┘
```

SELECTIVE WORDLINE SCANS BASED ON A DATA STATE METRIC

TECHNICAL FIELD

Embodiments of the disclosure relate generally to memory sub-systems, and more specifically, relate to selective wordline scans based on a data state metric.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 is a flow diagram of an example method for performing data integrity checks, in accordance with some embodiments of the present disclosure.

FIG. 3 is a flow diagram of another example method for performing data integrity checks, in accordance with some embodiments of the present disclosure.

DETAILED DESCRIPTION

Figure 1:
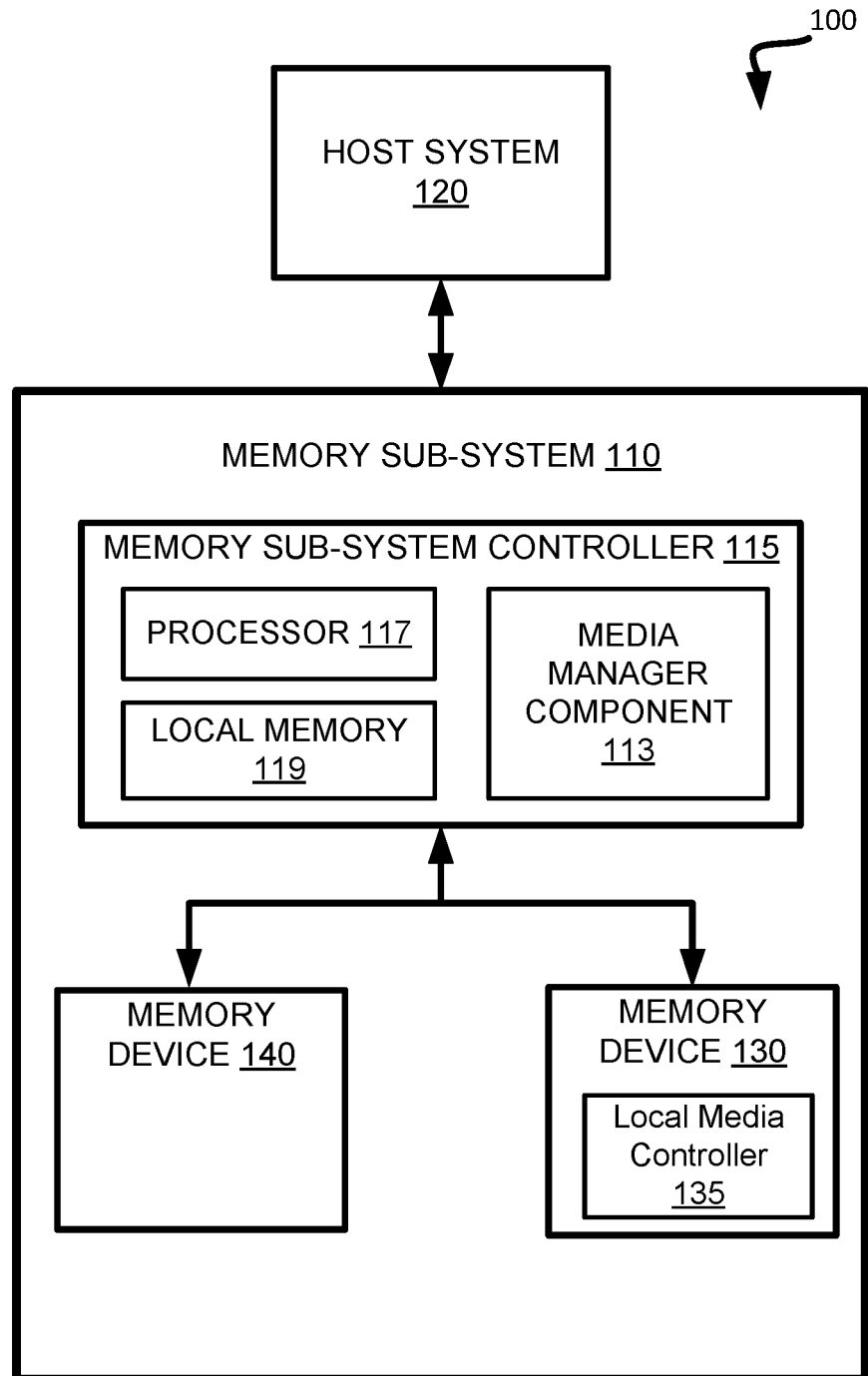
FIG. 1 illustrates an example computing system that includes a memory sub-system in accordance with some embodiments of the present disclosure.

Aspects of the present disclosure are directed a selective wordline scans based on a data state metric. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. The memory device can include single-level cells (SLCs) that each store one bit of data, multi-level cells (MLCs) that each store two bits of data, triple-level cells (TLCs) that each store three bits of data and/or quad-level cells (QLCs) that each store four bits of data. Data is stored inside each memory cell as one or more threshold voltages of the memory cell depending on the type of memory cell.

Each block can be organized as a two-dimensional array of memory cells. Memory cells in the same row form a wordline and the transistors of memory cells in the same column (each memory cell from a different memory page) are bound together to form a bit line. Only one memory cell is read at a time per bit line. When data is written to a memory cell of the memory sub-system for storage, the memory cell can deteriorate. Accordingly, each memory cell of the memory sub-system can have a finite number of write operations performed on the memory cell before the memory cell is no longer able to reliably store data. Data stored at the memory cells of the memory sub-system can be read from the memory sub-system and transmitted to a host system. For example, during a read operation, a read reference voltage is applied to the wordline containing the data to be read, while a pass through voltage is applied to wordlines of unread memory cells. The pass through voltage is a read reference voltage higher than any of the stored threshold voltages. However, when data is read from a memory cell of the memory sub-system, nearby or adjacent wordlines can experience what is known as read disturb.

Read disturb is a phenomenon in NAND memory where reading data from a memory cell can cause the threshold voltage of unread memory cells in the same block to shift to a higher value. In particular, the high pass-through voltage induces electric tunneling that can shift the threshold voltages of unread cells to higher values. Each threshold voltage shift can be small, but these shifts can accumulate over time and become large enough to alter the state of some memory cell, which can cause read disturb errors. Read disturb is the result of continually reading from one wordline without intervening erase operations, causing other memory cells in nearby wordlines to change over time. If too many read operations are performed on a wordline, data stored at adjacent wordlines of the memory sub-system can become corrupted or incorrectly stored at the memory cell(s). This can result in a higher error rate of the data stored at the wordline. This can increase the use of an error detection and correction operation (e.g., an error control operation) for subsequent operations (e.g., read and/or write) performed on the wordline. The increased use of the error control operation can result in a reduction of the performance of the conventional memory sub-system. As more resources of the memory sub-system are used to perform the error control operation, fewer resources can be used to perform other read operations or write operations.

The error rate associated with data stored at the block can increase due to read disturb. Therefore, using a read operation counter, upon a threshold number of read operations being performed on the block, a conventional memory sub-system can perform the data integrity check to verify that the data stored at the block does not include any errors. During the data integrity check, one or more values of a data state metric are determined for data stored at each wordline of the block. "Data state metric" herein shall refer to a quantity that is measured or inferred from the state of data stored on a memory device. Specifically, the data state metrics may reflect the state of the temporal voltage shift, the degree of read disturb, and/or other measurable functions of the data state. A composite data state metric is a function (e.g., a weighted sum) of a set of component state metrics. One example of a data state metric is residual bit error rate (RBER). The RBER corresponds to a number of bit errors per unit of time that the data stored at the block includes an error.

Conventionally, if the data state metric for a wordline of the block exceeds a threshold value, indicating a high error rate associated with data stored at the wordline due, at least in part, to read disturb, then a media management operation (also referred to as "folding") can be performed to relocate the data stored at the wordline or entire block to a new block of the memory sub-system. The folding of the data stored at the wordline or the block to the other block can include writing the data stored at the wordline or the block to the other block to refresh the data stored by the memory sub-system, in order to mitigate the read disturb associated with the data and erase the data at the wordline or the block. However, as previously discussed, read disturb can affect memory cells of wordlines that are adjacent to the wordline that a read operation is performed on. Therefore, read disturb can induce a non-uniform stress on memory cells of the block if particular memory cells are read from more frequently (e.g., a random or targeted read). For example, wordlines of a block that are adjacent to a wordline that is frequently read from can have a high error rate, while wordlines that are not adjacent to the wordline that is frequently read can have a lower error rate due to a reduced impact by read disturb on these memory cells. This is because wordlines adjacent to a wordline being read require a higher pass through voltage than wordlines that are not adjacent.

The read operation counter is used for each block on the memory sub-system. Since a memory sub-system controller cannot easily detect which type of read pattern (sequential read pattern, targeted read pattern, etc.) is used on the memory block, nor which wordlines are read more frequently than other, all wordlines of a block are scanned during the data integrity check. However, scanning every wordline of the block is expensive in terms of system resources. Further, keeping a read line counter for each wordline of the block may not be practical because it would utilize excessive memory sub-system resources. This can result in a decrease of performance of the memory sub-system and increase the power consumption of the memory sub-system. Furthermore, scanning of each wordline during each integrity check can decrease the lifespan of the memory sub-system.

Aspects of the present disclosure address the above and other deficiencies by implementing a memory sub-system controller capable of performing selective wordline scans based on a data state metric. In an illustrative example, the memory sub-system controller can, responsive to a read operation counter satisfying a scan threshold criterion, trigger a data integrity check and identify a data state metric value (e.g., an RBER value) for each wordline of a block of the memory sub-system. A data state metric value of a wordline exceeding a refresh threshold criterion indicates a high error rate associated with data stored at that wordline (due to, in part, read disturb) and can trigger a media management operation (e.g., a folding operation). Responsive to detecting no data state metric values exceeding the refresh threshold criterion, the memory sub-system controller can reset the read operation counter. Once the read operation counter satisfies the read threshold criterion again, the memory sub-system controller can trigger a new data integrity check and determine new data state metric values for the wordlines of the block. However, wordlines having a low (below an inclusion threshold criterion) data state metric value associated with the initial data integrity check are excluded from the new data integrity check. This allows the memory sub-system controller to scan fewer wordlines in subsequent data integrity checks. Responsive to detecting no data state metric values exceeding the refresh threshold criterion in the new data integrity check, the memory sub-system controller can again reset the read operation counter. During a subsequent data integrity check, wordlines that were excluded from a preceding data integrity check can be automatically included in the subsequent data integrity check. Further, wordlines that experienced no change in their data state metric values between two consecutive preceding data integrity checks can be excluded from the subsequent data integrity check. Responsive to detecting a data state metric value of a wordline exceeding a refresh threshold criterion during any data integrity check, the memory sub-system controller can trigger the media management operation with respect to the one or more wordlines of the block.

Advantages of the present disclosure include, but are not limited to, an improved performance of the memory sub-system by reducing the number of wordlines scanned during data integrity checks performed by the memory sub-system. Since the number of wordlines scanned is reduced, the amount of resources of the memory sub-system devoted to performing the data integrity scans is also reduced. This can result in an improvement of performance of the memory sub-system and a decrease in power consumption by the memory sub-system. Furthermore, this can increase the lifespan of the memory sub-system. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a media manager component 113 that can be used to track and manage data in the memory device 130 and the memory device 140. In some embodiments, the memory sub-system controller 115 includes at least a portion of the media manager component 113. In some embodiments, the media manager component 113 is part of the host system 120, an application, or an operating system. In other embodiments, local media controller 135 includes at least a portion of media manager component 113 and is configured to perform the functionality described herein. The media manager component 113 can communicate directly with the memory devices 130 and 140 via a synchronous interface. Furthermore, transfers of data between the memory device 130 and the memory device 140 can be done within the memory sub-system 110 without accessing the host system 120.

The media manager component 113 can perform selective wordline scans on a block based on a data state metric. As discussed above, the data state metric is a quantity that is measured or inferred from the state of data stored on a memory device. In an example, a data state metric is a residual bit error rate (RBER), which corresponds to a number of bit errors per unit of time that the data stored at the block includes an error. A media manager component 113 can identify or indicate a read operation to be used by memory device 130 and/or memory device 140 to retrieve data (e.g., pages) that is stored at a particular location of memory device 130, 140. Each of the pages may be accessed by a wordline and a bit line (or bit line group) of the memory device 130, 140. For example, the media manager component 113 may provide a read operation to assert (e.g., provide a voltage input) at particular wordline and a particular bit line to retrieve data stored at a corresponding memory page of the memory device 130, 140. As a result, data can be retrieved from memory pages of the memory device 130, 140 by providing voltage inputs at wordlines and bit lines.

The media manager component 113 can track read operations using a read operation counter. For example, each read operation performed on a block of the memory device 130, 140 can increment a read operation counter value by 1 for that block. Responsive to the read operation counter value satisfying a scan threshold criterion (e.g., exceeding 10,000 read operations, 100,000 read operations, etc.), the media manager component 113 can trigger a data integrity check on the block. Each data integrity check can identify a data state metric value (e.g., an RBER value) for one or more wordlines of the block. In some embodiments, the data integrity check can include reading data from the set of sampled memory cells in the block. Upon reading the data from the set of sampled memory cells, an error correction operation can be performed on the read data. In some implementations, the error correction operation can be an error-correcting code (ECC) operation or another type of error detection and correction operation to detect and correct an error. During the error correction operation one or more data state metrics, such as RBER, can be determined for the data read from the set of sampled memory cells. In some embodiments, the set of sampled memory cells in the block can be one or more memory cells of the block, a wordline, a group of wordlines in the block, or any combination thereof. For example, the set of sampled memory cells can be a group of three wordlines in the block.

The data state metric values can be associated with different operations. In a first example, a data state metric value exceeding a refresh threshold criterion can trigger a media management operation (e.g., a folding operation). For example, the media management operation can write the data stored at the wordline to a new block to refresh the data stored by the memory sub-system 110. In another example, the media management operation can write the data stored at the entire block to a new block to refresh the data stored by the memory sub-system 110. If a data integrity check yields no data state metric values exceeding the refresh threshold criterion, the media manager component 113 can reset the read operation counter.

In a second example, a data state metric value falling below an inclusion threshold criterion can trigger an exclusion operation. For example, each wordline associated with a data state metric value below the inclusion threshold criterion is excluded from a subsequent data integrity check. The media manager component 113 can include the excluded wordlines in a data integrity check performed after the subsequent data integrity check.

In some embodiments, wordlines that experienced no change in their data state metric values between two consecutive preceding data integrity checks can be excluded from the subsequent data integrity check. For example, if the data state metric value associated with a wordline is the same in a first data integrity check and a second data integrity check, the block management component 113 can exclude the wordline during a third data integrity check. The media manager component 113 can then include the wordline during a fourth data integrity check. Further details with regards to the operations of the media manager component 113 are described below.

FIG. 2 is a flow diagram of an example method 200 for performing data integrity checks, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic identifies, among a first plurality of wordlines of a set of pages of the memory device, at least one wordline having a current value of a data state metric satisfying a first condition. In some embodiments, the current value of a data state metric is a RBER value. In some embodiments, the first condition includes the current value being below an inclusion threshold criterion. In an example, a data state metric value below the inclusion threshold criterion can trigger an exclusion operation where the wordline associated with a data state metric value below the inclusion threshold criterion is excluded from a subsequent data integrity check. In some embodiments, the processing logic can determine values of the data state metric responsive to the read operation counter exceeding the scan threshold criterion.

At operation 220, the processing logic determines new values of the data state metric of a second plurality of wordlines of the set of pages, wherein the at least one wordline is excluded from the plurality of wordlines.

At operation 230, responsive to determining that the new values of the data state metric of one or more wordlines of the second plurality of wordlines satisfy a second condition, the processing logic performs a media management operation with respect to the one or more wordlines. In some embodiments, the second condition includes at least one of the new values exceeding a refresh threshold criterion. In an example, the media management operation includes the processing logic writing the data stored at the one or more wordlines to a new block to refresh the data. In another example, the media management operation includes the processing logic writing the data stored at the entire block to a new block to refresh the data stored. If the data integrity check yields no data state metric values satisfying the second condition (e.g., exceeding the refresh threshold criterion), the processing logic can reset the read operation counter.

In some embodiments, if a wordline is excluded from a determining of new values of the data state metric (e.g., a data integrity check), the processing logic can include the excluded wordline in a subsequent determining of further new values of the data state metric (e.g., a subsequent data integrity check). This can prevent a wordline from being excluded from consecutive data integrity checks.

In some embodiments, the processing logic can exclude a wordline from a data integrity check when that wordline has a same data state metric value in two consecutive data integrity checks. For example, if the data state metric value associated with a wordline is the same in the first two data integrity checks, the processing logic can exclude that wordline during a third data integrity check. The wordline can then be included again during a subsequent (e.g., fourth) data integrity check.

FIG. 3 is a flow diagram of an example method 300 for performing data integrity checks, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 300 relates to determining data state metrics values of every two out of three consecutive wordlines during each data integrity check. As explained above, during a read operation, a read reference voltage is applied to the wordline containing the data to be read, while a pass through voltage is applied to the other wordlines in the block associated with the wordline being read. The pass through voltage is a read reference voltage higher than any of the stored threshold voltages. Wordlines adjacent (above and below) to the wordline being read require a higher pass through voltage than the wordlines that are not adjacent in the block. For example, a read reference voltage can be 5.5 volts, an adjacent pass through voltage can be 9.1 volts, and a non-adjacent pass through voltage can be 7.5 volts. As such, adjacent wordlines to the wordline being read can experience a higher degree of read disturb than non-adjacent wordlines. Accordingly, in a scenario where read operations are performed on a wordline disproportionally to other wordlines in the same block (e.g., row-hammer stress), by determining data state metrics values of every two out of three consecutive wordlines during each data integrity check, the system of the present disclosure can identify at least one of two wordlines with a high data state metric value (e.g., at least one of the adjacent wordlines) without scanning each wordline in the block. Thus, if one of the two adjacent wordlines has a data state metric value exceeding the refresh threshold criterion, a media management operation can be performed.

At operation 310, the processing logic identifies a first plurality of wordlines among a second plurality of wordlines of a set of pages of a memory device, wherein the first plurality of wordlines is fewer than the second plurality of wordlines. In some embodiments, the second plurality of wordlines includes a set of three consecutive wordlines and the first plurality of wordlines includes any two world lines of the three consecutive wordlines.

At operation 320, the processing logic determines values of a data state metric of each of the first plurality of wordlines. In some embodiments, each value of the data state metric is a RBER value.

At operation 330, responsive to determining that the values of the data state metric of one or more wordlines of the first plurality of wordlines satisfy a condition, the processing logic performs a media management operation with respect to the second plurality of wordlines. In some embodiments, the condition includes at least one of the new values exceeding a refresh threshold criterion. In an example, the media management operation includes the processing logic writing the data stored at the one or more wordlines to a new block to refresh the data. In another example, the media management operation includes the processing logic writing the data stored at the entire block to a new block to refresh the data stored. If the data integrity check yields no data state metric values satisfying the second condition (e.g., exceeding the refresh threshold criterion), the processing logic can reset the read operation counter. In subsequent scan, the processing logic can determine new values of the data state metric of the same first plurality of wordlines, or a plurality of wordlines from the second plurality of wordlines.

Figure 4:
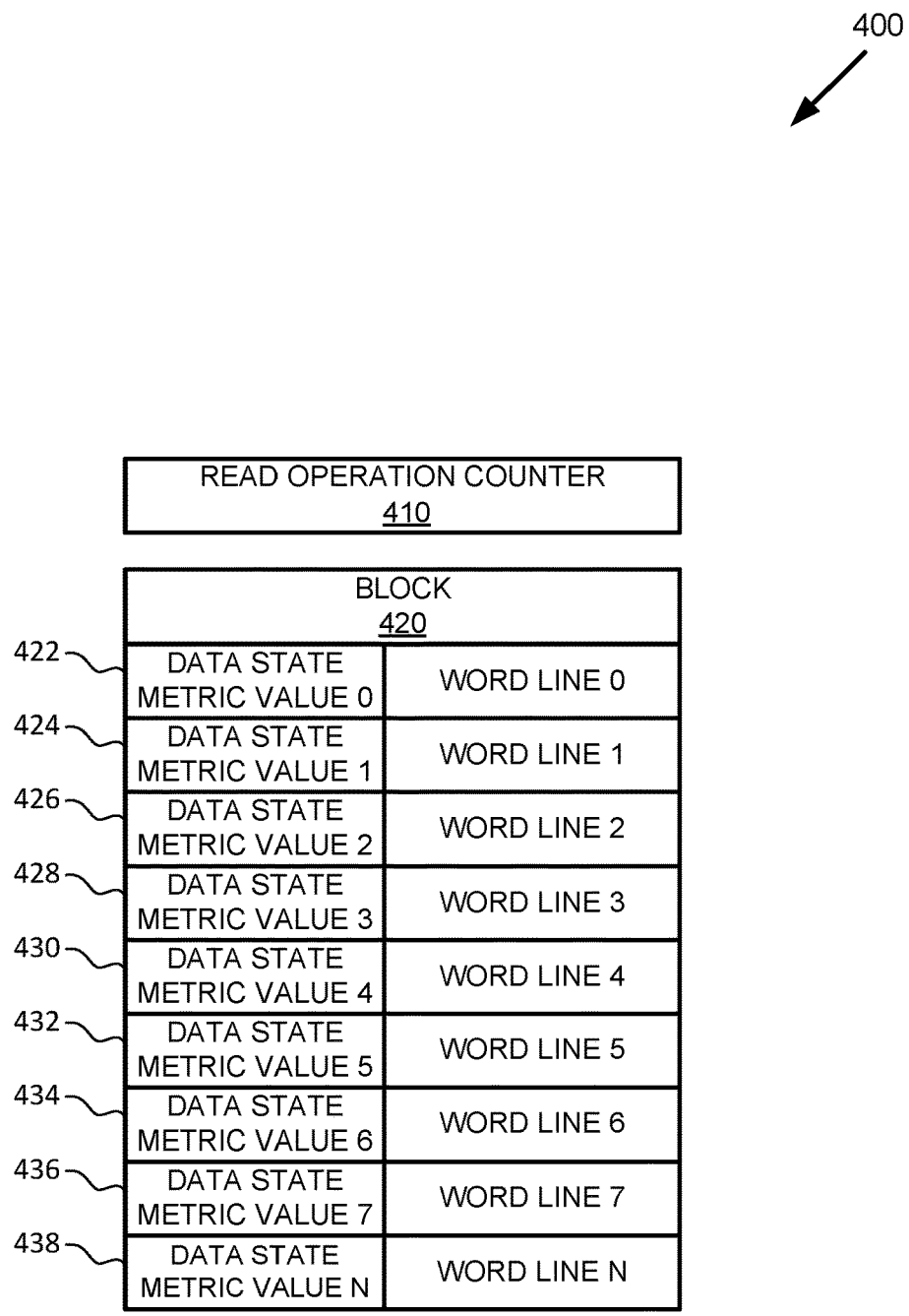
FIG. 4 is an illustration of a memory sub-system determining data state metric values for wordlines in a block, in accordance with some embodiments of the present disclosure.

FIG. 4 is an illustration of a memory sub-system 400 determining data state metric values for wordlines in a block, in accordance with some embodiments of the disclosure. Memory sub-system 400 includes a read operation counter 410 and a block 420. The memory sub-system 400 can track read operations using read operation counter 410. For example, each read operation performed on block 420 can increment a value of the read operation counter 410 by 1. Responsive to the read operation counter value satisfying a scan threshold criterion (e.g., exceeding 10 thousand read operations, 100,000 read operations, etc.), the memory sub-system 400 can trigger a data integrity check on block 420.

Figure 5:
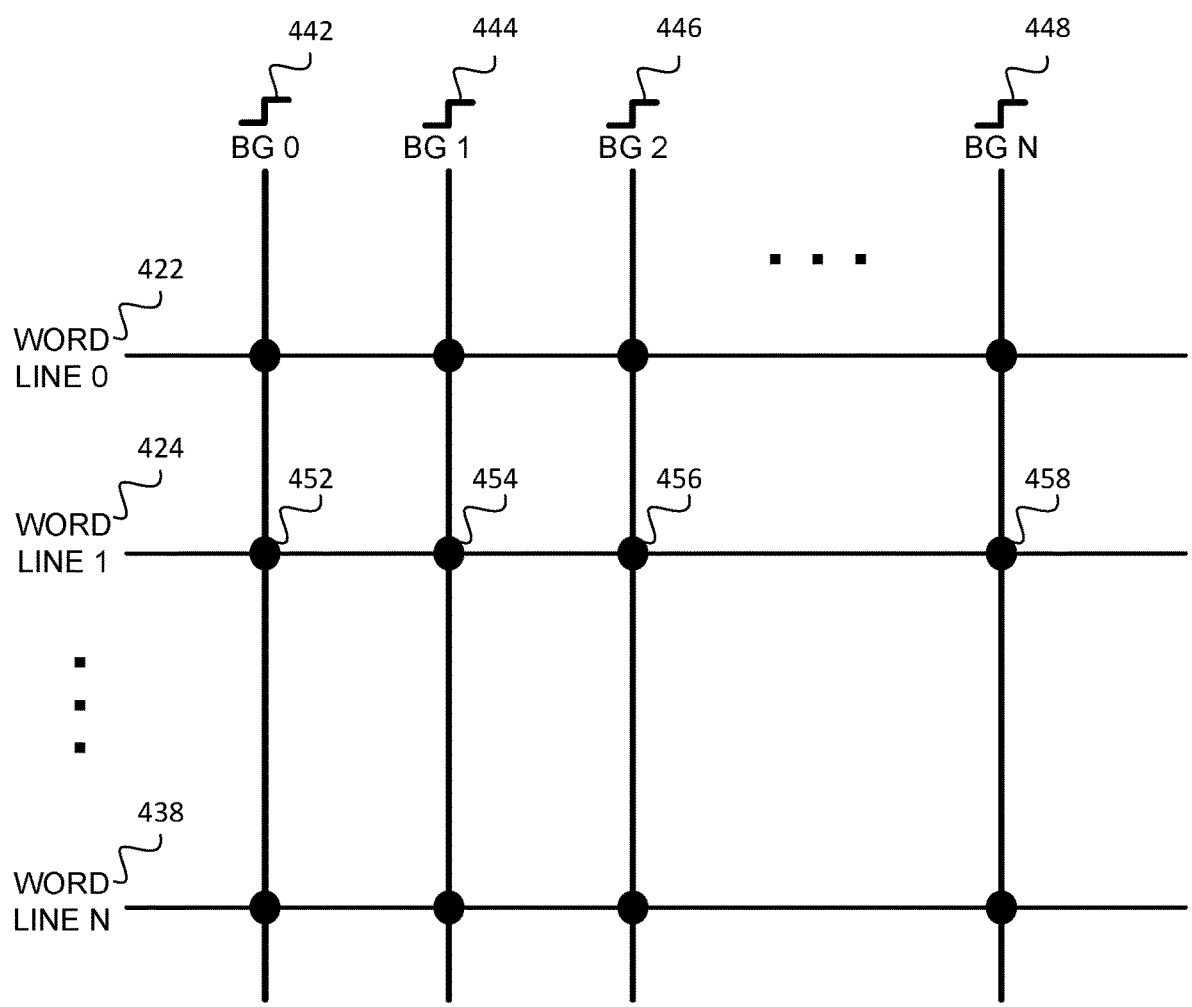
FIG. 5 is an architecture of wordlines and bit lines of a block, in accordance with some embodiments of the present disclosure.

Block 420 can be organized as a two-dimensional array of memory cells, as shown in FIG. 5. FIG. 5 illustrates the architecture of wordlines and bit lines of block 420. Memory cells in the same row form a wordline (e.g., wordline 0 (422), wordline 1 (424), wordline N (438)) and the transistors of memory cells in the same column (each memory cell from a different memory page) are bound together to form a bit line (e.g., bit line group (BG) 0 (442), bit line group 1 (444), bit line group 2 (446), and bit line group N (448). The intersection of a wordline and a bit line may correspond to a memory cell or a memory page at a corresponding physical block address. For example, memory cells 452, 454, 456, 458 form wordline 1 (424). Only one memory cell is read at a time per bit line. During a read operation, a read reference voltage is applied to the wordline containing the data to be read, while a pass through voltage is applied to wordlines of unread memory cells. The pass through voltage is a read reference voltage higher than any of the stored threshold voltages.

Returning to FIG. 4, by way of example, block 420 includes nine wordlines, each wordline associated with a data state metric value. For example, wordline 0 (422) is associated with data state metric value 0, wordline 1 (424) is associated with data state metric value 1, wordline 2 (426) is associated with data state metric value 2, wordline 3 (428) is associated with data state metric value 3, wordline 4 (430) is associated with data state metric value 4, wordline 5 (432) is associated with data state metric value 5, wordline 6 (434) is associated with data state metric value 6, wordline 7 (436) is associated with data state metric value 7, wordline N (438) is associated with data state metric value N.

During the data integrity check on block 420, the memory sub-system 400 can determine a data state metric value (e.g., an RBER value) for each wordline (e.g., wordlines 422-438) of block 420. For example, the data integrity check can include reading data from the set of sampled memory cells in each wordline 422-438, and performing an error correction operation on the read data. During the error correction operation, the data state metrics can be determined for the data read from the set of sampled memory cells. The data state metric values can be updated during subsequent data integrity checks.

In some embodiments, if a data state metric value exceed a refresh threshold criterion, the memory sub-system 400 can trigger a media management operation (e.g., a folding operation). For example, if a value of data state metric value 6, which is associated with wordline 6 (434), exceed the refresh threshold criterion, the memory sub-system 400 can i) write the data stored at wordline 6 (434) to a new block, ii) write the data stored at block 420 to a new block, or iii) perform another media management operation. If a data integrity check yields no data state metric values exceeding the refresh threshold criterion, the memory sub-system can reset read operation counter 410.

In some embodiments, a data state metric value below an inclusion threshold criterion can trigger an exclusion operation. For example, if data state metric value 0 is below the inclusion threshold criterion, memory sub-system 400 can exclude wordline 0 from a subsequent data integrity check. Thus, during the subsequent data integrity check, memory sub-system 400 can determine a new data state metric value for wordlines 424-438 only. The memory sub-system 400 can include wordline 0 (422) in a data integrity check performed after the subsequent data integrity check.

In some embodiments, wordlines that experienced no change in their data state metric values between two consecutive data integrity checks can be excluded from a subsequent data integrity check. For example, if the data state metric value 1 did not increase during two consecutive data integrity checks, the memory sub-system can exclude wordline 1 from the subsequent.

Figure 6:
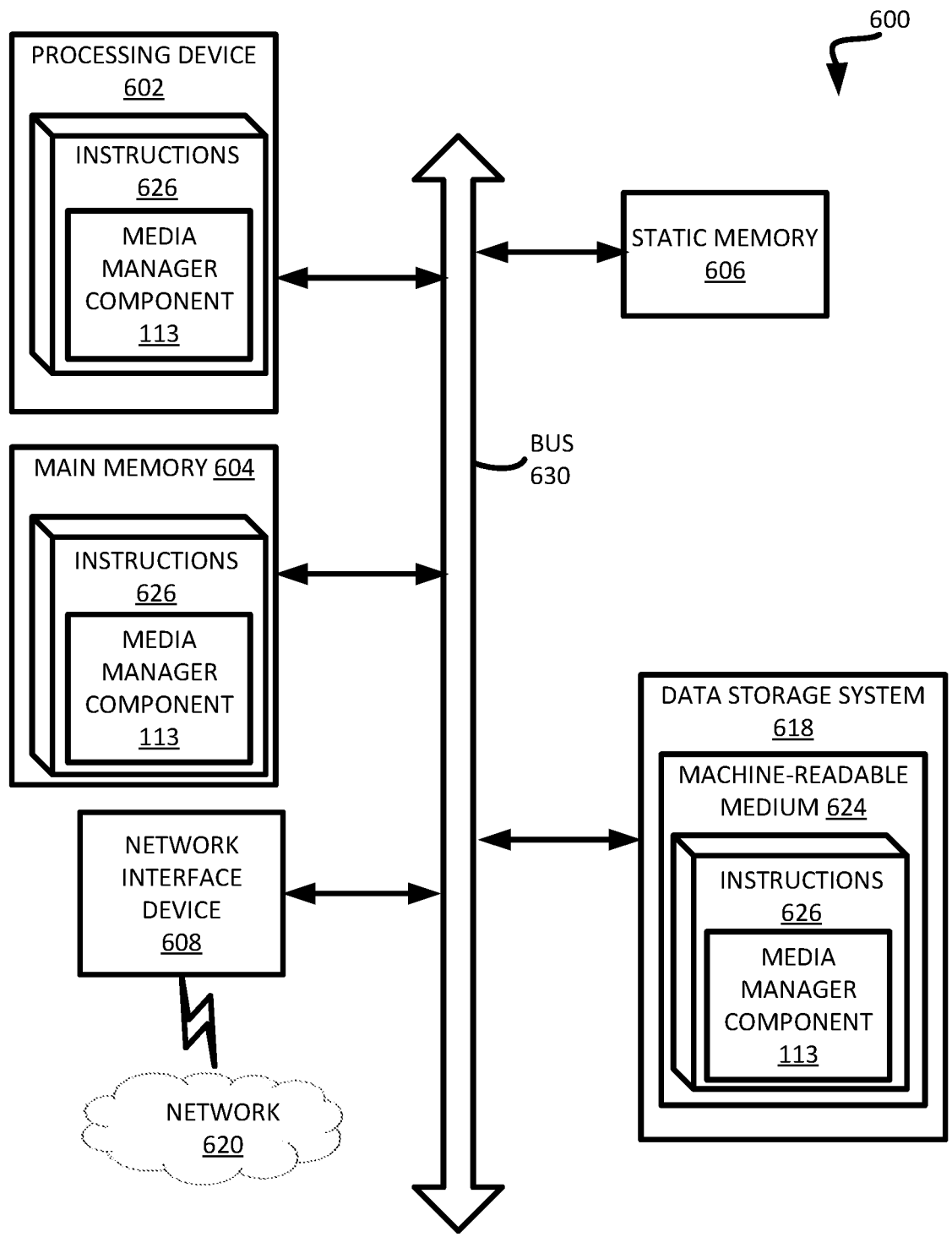
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to media manager component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
identifying, among a first plurality of wordlines of a set of pages of the memory device, at least one wordline having a current value of a data state metric satisfying a first condition;

determining new values of the data state metric of a second plurality of wordlines of the set of pages, wherein the at least one wordline is excluded from the second plurality of wordlines; and responsive to determining that the new values of the data state metric of one or more wordlines of the second plurality of wordlines satisfy a second condition, performing a media management operation with respect to the one or more wordlines.

2. The system of claim 1, wherein the processing device to perform further operations comprising:

including the at least one excluded wordline in a subsequent determining of further new values of the data state metric.

3. The system of claim 1, wherein the processing device to perform further operations comprising:

determining further new values of the data state metric of a third plurality of wordlines of the set of pages, wherein at least one wordline having a same current value of the data state metric as its new value is excluded from the third plurality of wordlines.

4. The system of claim 1, wherein the data state metric comprises a residual bit error rate (RBER).

5. The system of claim 1, wherein the first condition comprises the current value of the data state metric being below an inclusion threshold criterion.

6. The system of claim 1, wherein the second condition comprises at least one of the new values exceeding a refresh threshold criterion.

7. The system of claim 1, wherein the media management operation comprises writing data stored at the one or more wordlines to a new block.

8. The system of claim 1, wherein the media management operation comprises writing data stored at an entire block associated with the one or more wordlines to a new block.

9. A method, comprising:

identifying a first plurality of wordlines among a second plurality of wordlines of a set of pages of a memory device;

determining values of a data state metric of each wordline of the first plurality of wordlines; and responsive to determining that the values of the data state metric of one or more wordlines of the first plurality of wordlines satisfy a condition, performing a media management operation with respect to the second plurality of wordlines.

10. The method of claim 9, wherein the second plurality of wordlines comprises a set of three consecutive wordlines.

11. The method of claim 9, wherein the data state metric comprises a residual bit error rate (RBER).

12. The method of claim 9, wherein the condition comprises at least one of the values of the data state metric exceeding a refresh threshold criterion.

13. The method of claim 9, wherein the media management operation comprises writing data stored at the second plurality of wordlines to a new block.

14. The method of claim 9, wherein the media management operation comprises writing data stored at an entire block associated with the second plurality of wordlines to a new block.

15. A non-transitory computer-readable storage medium comprising instructions that, when executed by a processing device operatively coupled to a memory, performs operations comprising:

identifying, among a first plurality of wordlines of a set of pages of the memory device, at least one wordline having a current value of a data state metric satisfying a first condition;

determining new values of the data state metric of a second plurality of wordlines of the set of pages, wherein the at least one wordline is excluded from the second plurality of wordlines; and responsive to determining that the new values of the data state metric of one or more wordlines of the second plurality of wordlines satisfy a second condition, performing a media management operation with respect to the one or more wordlines.

16. The non-transitory computer-readable storage medium of claim 15, wherein the processing device to perform further operations comprising:

including the at least one excluded wordline in a subsequent determining of further new values of the data state metric.

17. The non-transitory computer-readable storage medium of claim 15, wherein the processing device to perform further operations comprising:

determining further new values of the data state metric of a third plurality of wordlines of the set of pages, wherein at least one wordline having the same current value and new value is excluded from the third plurality of wordlines.

18. The non-transitory computer-readable storage medium of claim 15, wherein the data state metric comprises a residual bit error rate (RBER).

19. The non-transitory computer-readable storage medium of claim 15, wherein the first condition comprises the current value of the data state metric being below an inclusion threshold criterion.

20. The non-transitory computer-readable storage medium of claim 15, wherein the second condition comprises at least one of the new values exceeding a refresh threshold criterion.

* * * * *